United States Patent
Ramirez et al.

(10) Patent No.: US 10,921,126 B2
(45) Date of Patent: Feb. 16, 2021

(54) SYSTEMS AND METHODS FOR NAVIGATION USING PULSARS

(71) Applicants: Ayax D. Ramirez, Chula Vista, CA (US); Stephen D. Russell, San Diego, CA (US); Marcio C. de Andrade, San Diego, CA (US); Lee C. Lemay, San Diego, CA (US)

(72) Inventors: Ayax D. Ramirez, Chula Vista, CA (US); Stephen D. Russell, San Diego, CA (US); Marcio C. de Andrade, San Diego, CA (US); Lee C. Lemay, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 162 days.

(21) Appl. No.: 16/225,256

(22) Filed: Dec. 19, 2018

(65) Prior Publication Data
US 2020/0200538 A1 Jun. 25, 2020

(51) Int. Cl.
*G01C 21/02* (2006.01)
*G01S 19/45* (2010.01)
(Continued)

(52) U.S. Cl.
CPC .............. *G01C 21/02* (2013.01); *G01C 21/20* (2013.01); *G01S 19/45* (2013.01); *G01R 33/0354* (2013.01)

(58) Field of Classification Search
CPC ......... G01C 21/02; G01C 21/20; G01S 19/45; G01R 33/0354
See application file for complete search history.

(56) References Cited

U.S. PATENT DOCUMENTS 3,550,002 A 12/1970 Shostak et al.
6,051,846 A 4/2000 Burns et al.
(Continued)

OTHER PUBLICATIONS

Winternitz et al.; "X-ray pulsar navigation algorithms and testbed for SEXTANT"; 2015 IEEE Aerospace Conf., Big Sky, MT; pp. 1-14 (Year: 2015).*
(Continued)

*Primary Examiner* — Michael J Zanelli
(74) *Attorney, Agent, or Firm* — Naval Information Warfare Center, Pacific; Kyle Eppele; Arthur K. Samora

(57) ABSTRACT

Pulsating radio star (PULSAR) navigation systems and methods can include a plurality of PULSARs that can emit PULSAR radiation pulses in the millisecond range, and a plurality of Josephson Junctions (JJs) that can be arranged as an array of microantennas. The systems and methods can include a cryogenic cooling system for cooling the JJs to an operating temperature based on the JJ materials, and a thermal management system for maintaining the operating temperature. An oscillator can determine times of arrival (TOAs) of magnetic field components of the PULSAR pulses. A processor can compute the terrestrial position of the navigation system using the TOAs and the known celestial position of the PULSARs. A GPS sub-system can be included for navigation using GPS signals. The processor can be configured to compute terrestrial location using the PULSAR magnetic field components when GPS signal strength falls below a predetermined level or is lost.

18 Claims, 3 Drawing Sheets

(51) Int. Cl.
*G01C 21/20* (2006.01)
*G01R 33/035* (2006.01)

(56) References Cited

U.S. PATENT DOCUMENTS

| | | | |
|---|---|---|---|
| 6,165,801 | A | 12/2000 | Burns et al. |
| 6,690,162 | B1 | 2/2004 | Schopohl et al. |
| 7,197,381 | B2 | 3/2007 | Sheikh et al. |
| 7,369,093 | B2 | 5/2008 | Oppenlander et al. |
| 8,179,133 | B1 | 5/2012 | Kornev et al. |
| 2013/0006449 | A1* | 1/2013 | Hindman .............. G01J 3/0205 701/13 |
| 2017/0045592 | A1* | 2/2017 | Berggren ........... G01R 33/0206 |
| 2017/0131096 | A1* | 5/2017 | Karlov ................ G01C 21/165 |
| 2017/0146618 | A1* | 5/2017 | Leese de Escobar ...................... G01R 33/0354 |

OTHER PUBLICATIONS de Andrade et al.; "Detection of Far-Field Radio-Frequency Signals by Niobium Superconducting Quantum Interference Device Arrays"; IEEE Trans. on Applied Superconductivity, vol. 25, No. 5; Oct. 2015 (Year: 2015).*

Kabakchiev et al.; "Time of Arrival Estimation in Pulsar-Based Navigation Systems"; 2015 Signal Processing Symposium; IEEE; Jun. 10-12, 2015 (Year: 2015).*

\* cited by examiner

SYSTEMS AND METHODS FOR NAVIGATION USING PULSARS

FEDERALLY-SPONSORED RESEARCH AND DEVELOPMENT

The United States Government has ownership rights in this invention. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil, referencing Navy Case 103989.

FIELD OF THE INVENTION

This invention can pertain generally to navigation systems. More particularly, the invention can pertain to navigation systems that can use radiation signals for navigation. The present invention can be particularly, but not exclusively, useful as a persistent, redundant, frequency-agnostic navigation system that can use pulsating radio star (PULSAR) radiation signals to calculate the position of the platform on which the system is deployed.

BACKGROUND OF THE INVENTION

Pulsating radio stars (PULSARs) can be defined as celestial objects with a known celestial position relative to the earth. PULSARs can emit pulses of radiation, especially radiofrequency (RF) waves, with a high degree of regularity. Since the first discovery of PULSARs in 1967, the number of known PULSARs has multiplied, and thousands of PULSARs (and their position celestial relative to the earth) are known. FIG. 1 shows a map of the sky as viewed from the earth, which can depict PULSARs having energies greater than 1 billion electron volts (GeV) as known in the prior art, according to five years of data from NASA's Fermi Gamma-ray Large Area Space Telescope. The white dots can indicate PULSARs, while brighter colors can indicate PULSARs having brighter gamma-ray sources. The map can be shown in galactic coordinates, which places the mid-plane of the earth's galaxy along the horizontal centerline of FIG. 1.

As mentioned above, in the map of FIG. 1, some of the brighter gamma-ray emitting PULSARs are noted with brighter orange and yellow colors. Further, FIG. 1 illustrates PULSAR gamma ray emissions. However, most PULSAR emissions that are at gamma frequency can be extremely weak, which can require a large radio telescope to detect its emissions in the gamma frequency range at the surface of the earth, as gamma rays are generally thought of in the prior art as being in the range greater than $10^{19}$ Hz, and having wavelengths less than 10 picometers. In addition, very sensitive receivers, processing equipment, and sophisticated analyses can also be required to identify the weak radiation. Because of the size of the antenna and the frequency and signal strength of the arriving PULSAR signal, it has not been feasible in the past to use PULSAR radiation for mobile, terrestrial navigation applications.

Additionally, for navigation applications it is necessary to have a very stable, consistent source of radiation. While it is well established that PULSARs can emit radiation at different frequencies, the most stable and consistent PULSAR radiation pulses tend to be in the millisecond region. However, this most stable frequency range (kHz) emanating from PULSARs can make it extremely difficult to detect waves because it requires large dish antennas such as the radio telescopes in the Commonwealth Scientific and Industrial Research Organisation (CSIRO) Parkes observatory in Australia, or even larger dishes such as the dish located at the Arecibo observatory in Puerto Rico. The aforementioned dish antennas can vary from several meters to hundreds of meters in diameter, which can make a mobile or portable navigation system based on detecting the electromagnetic energy of a PULSAR in the millisecond region impractical.

In the prior art, this impracticality has not yet been overcome due to the concept of resonance, which can be of fundamental importance in the field of metallic antennas. More specifically, resonance can stand for the proposition that the size of the antenna is directly related to the wavelength of the electromagnetic wave it is designed to detect, so that incident signals at the antenna can be amplified and read with appropriate electronics. The resonance condition can substantially limit the frequency range over which an antenna can optimally perform. Small electric antennas, operating at higher frequencies, also experience a loss in sensitivity as the wavelength of the incoming signal is reduced.

A limited solution for the latter case can be to use semiconductors and superconductors as RF detectors, in order to detect photons without using the resonance condition. Nonetheless, semiconductors and superconductors have an intrinsic limit of operation to very high frequencies, and the geometry of manufacture of the detector device can often be an issue at very high frequencies. On the other hand, at lower frequencies, the magnitude of the signal can be detected due to the much larger sizes of the antennas, but only when the antenna is extremely large. The excessive size of the antennas at lower frequencies can limit the use of PULSARs for navigation applications.

In view of the above, it can be an object of the present invention to provide navigation systems and methods that can use PULSAR radiation for navigation. Another object of the present invention can be to provide navigation systems and methods that can use the magnetic component of PULSAR radiation for navigation purposes. Yet another object of the present invention can be to provide navigation systems and methods that can be resonance agnostic, or independent of the frequency and/or wavelength of the navigation signal that can be received. Still another object of the present invention can be to provide mobile navigation systems and methods that can use PULSAR radiation in the millisecond range for terrestrial navigations. Yet another object of the present invention can be to provide systems and methods for navigation that can accomplish a navigation function independently of a global positioning satellite (GPS) signal. Still another object of the present invention can be to provide PULSAR navigation systems and methods that can be integrated into an existing mobile GPS system as a redundancy, to provide persistent navigation, in the event the GPS signals are lost/denied to the user. Another object of the present invention can be to provide PULSAR navigation systems and methods that can be manufactured, deployed and/or accomplished in a relatively efficient, cost-effective manner.

SUMMARY OF THE INVENTION

Pulsating radio star (PULSAR) navigation systems and methods can include a plurality of pulsating radio stars (PULSARs), and a plurality of microantennas arranged as an array. The PULSARs can emit PULSAR radiation pulses in the millisecond range, and the array of microantennas can be configured to detect the magnetic field components of the millisecond PULSAR radiation pulses. An oscillator can be connected to the microantennas, for determining times of arrival (TOAs) of the magnetic field components of the PULSAR pulses at the array. The processor can compute the terrestrial position of the navigation system using the TOAs and the celestial position of the PULSARs, which can be known beforehand. The processor can compute the terrestrial position of the system using the respective magnetic components of multiple PULSAR radiation pulses, to result in a determinant system of equations and unknowns, which can be solved to yield the terrestrial position.

To detect the magnetic field components of the PULSARs, the array of microantennas can further include a plurality of Josephson Junctions (JJs), a cryogenic cooling system for cooling the JJs to a predetermined operating temperature corresponding to the JJ material, and a thermal management system for maintaining the JJs at the predetermined operating temperature. The systems and methods of the present invention can further include a GPS navigation sub-system that includes a GPS receiver for receiving GPS signals. The processor can be configured to compute the system's terrestrial location using the PULSAR magnetic field components when the GPS signal strength falls below a predetermined level, which can result in a persistent, redundant reliable navigation system.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF EMBODIMENTS

In brief overview, the invention can include mobile systems for position, navigation, and timing using superconducting quantum interference device (SQUID) micro antenna arrays, as well as methods for position, navigation, and timing using the SQUID arrays for detecting emissions from pulsating radio stars (PULSARs). This invention according to several embodiments can perform Time of Arrival (TOA) measurements on the pulses of radiation that are emitted by the PULSARs. Because the pulses of radiation can occur at extremely regular intervals, and the frequency of the pulsed radiation and the PULSAR celestial position is known, the TOA measurements can be used to calculate the change in this invention's position, or its position with respect to a fixed point, as well as the error accumulation in the navigation system's clock. With TOA measurements on multiple PULSARs and multiple computations, a complete solution for the system's platform position and time is possible. For some embodiments that are on airborne platforms, this invention can also use the directional sensitivity of its sensor to compute altitude for the invention by measuring the direction towards the PULSARs. The manner in which the above can be accomplished can be described more fully below.

Figure 1:
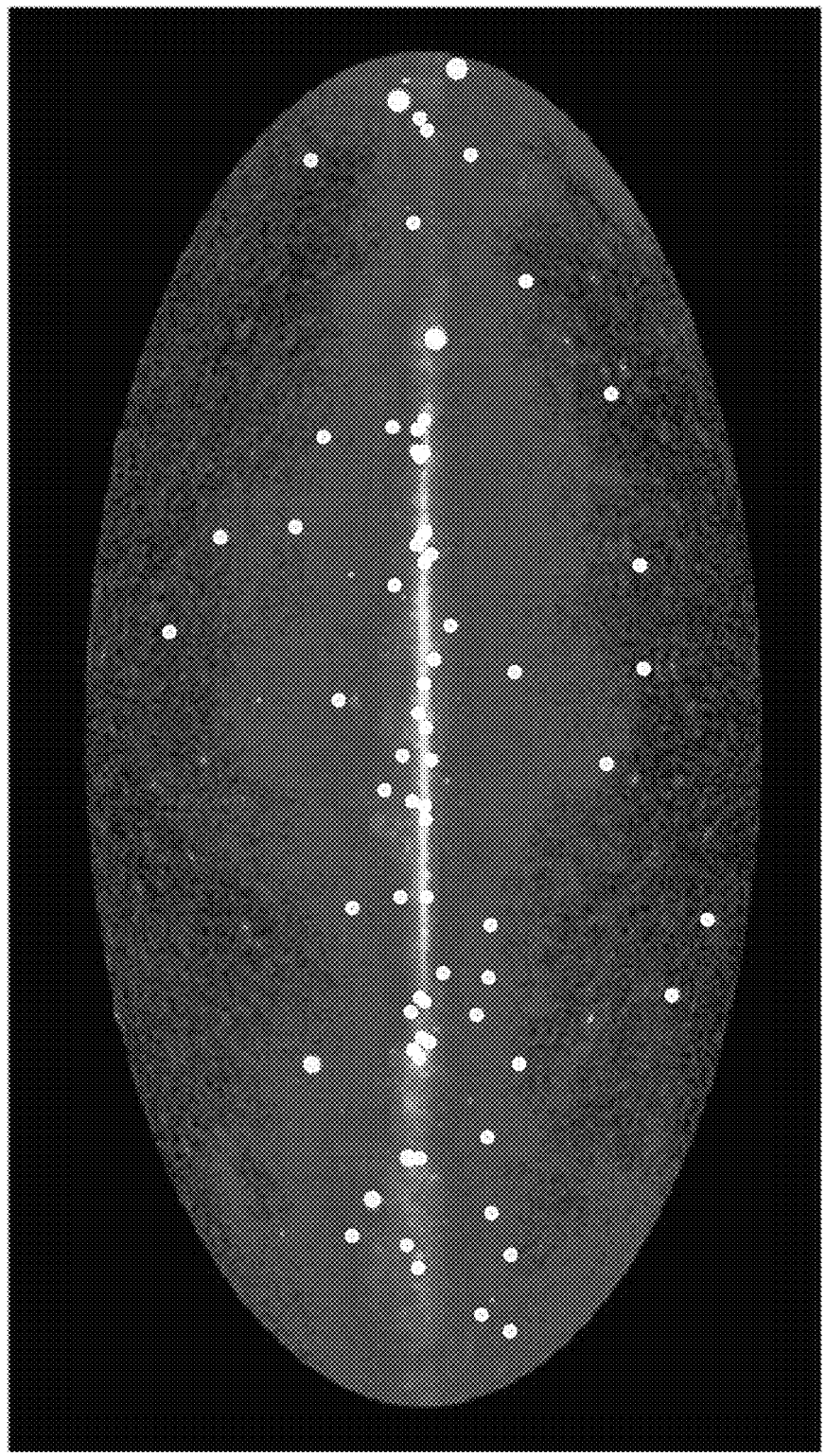
FIG. 1 can be a sky view map, which can represent the celestial positions of known pulsating radio stars (PULSARs) having energies greater than one billion electron volts (GeV)
Figure 2:
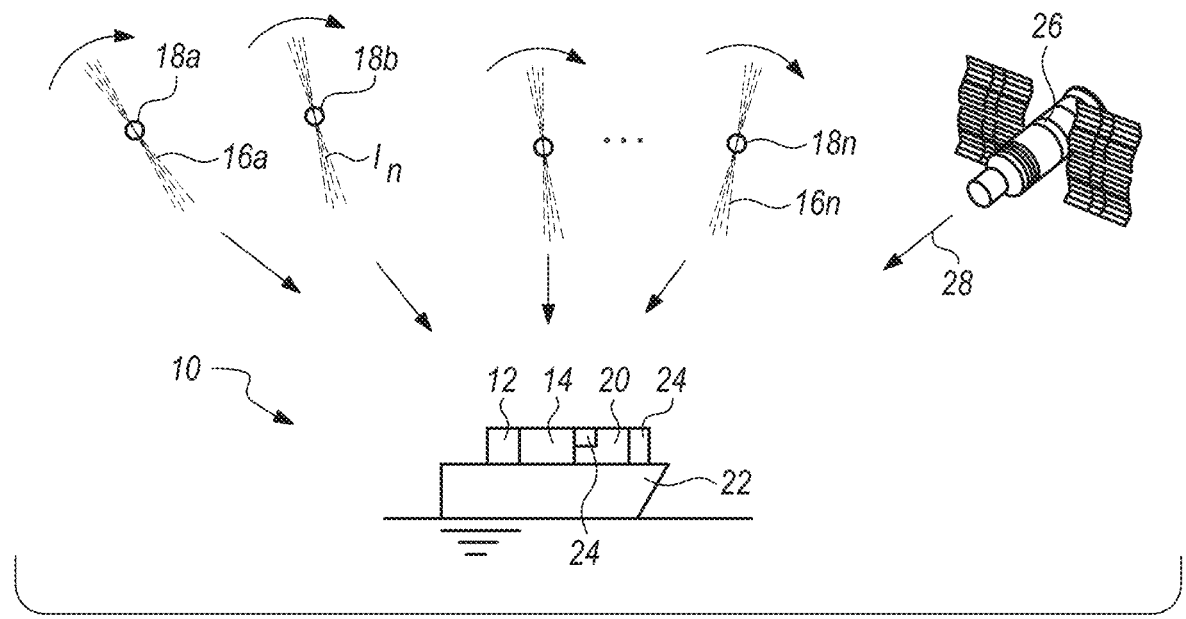
FIG. 2 can be a diagram of the PULSAR navigation systems and methods of the present invention, according to several embodiments.

Referring now to FIG. 2, a system for navigation using PULSARs can be shown, and can be generally designated using reference character 10. As shown, system 10 can include a plurality of microantennas, which can be arranged as an array 12. An oscillator 14 can be connected to the array 12 of microantennas. The microantennae can detect the radiation pulses $16a \ldots 16n$ of a plurality of corresponding pulsating radio stars (PULSARs) $18a \ldots 18n$. More specifically, the oscillator can detect the time of arrival (TOA) of the magnetic components $\phi_n$ of the radiation pulses 16 that can arrive and that can be detected by array 12.

A processor 20 can be connected to the oscillator 14. The processor can determine the terrestrial position of the platform 22 (in FIG. 2, platform 22 is a ship, but land-based and airborne platforms are certainly possible and are considered within the scope of the present invention) using the TOA's from oscillator 14 and the celestial position of the PULSARs 18, which can be known beforehand. The celestial positions of PULSARS 18 can be stored in a database 24, and can be called as necessary to fix the platform's position, using the systems and methods of the present invention. Some embodiments can also include at least one global position satellite (GPS) 26. GPS 26 can emit a GPS signal 28 at a frequency known in the art. GPS signal 28 can also be detected by array 12, and GPS signal 28 can be selectively used as desired by the operator to accomplish navigation.

As mentioned above, the systems and methods of the present invention can utilize micro-superconducting loops that can be configured to behave like micro-antennas that can detect magnetic component ϕ of PULSAR pulses 16. To do this, the superconducting loops can be configured with a number of Josephson Junctions, which can be engineered to function as microantennas that can detect radiofrequency energy. The SQUIDs in array 12 may consist of thousands of these superconducting loops containing Josephson junctions that are capable of detecting the magnitude of the magnetic field component ϕ, instead of the electric field component, of the traveling electromagnetic waves of pulses 16 from PULSARs 18. See for example U.S. patent application Ser. No. 15/360,323, by Anna Leese de Escobar, entitled "System and Method for Broadband Far and Near Field Radio Frequency Radiation Detector Utilizing Superconducting Quantum Detector Arrays", Navy Case 103,292. The contents fo the '343 application are hereby incorporated by reference herein.

The systems 10 of the present invention may be extremely compact in nature due to the use of these micro-arrays of antennas, particularly when compared to antennas in the prior art that are sized based on a resonance for reception of RF energy. The unique characteristic of the arrays, i.e., the configuration to detect magnetic vice electrical field of PULSAR radiation, is not present in any other sensors of navigation system in the prior art. This can allow for a receiving antenna to be of reduced physical dimensions, because the array 12 of the present invention is detecting radiofrequency (RF) energy in a manner that is independent of the incoming RF wavelength, i.e., the magnitude of the magnetic field component of the incoming RF. With this configuration, and because the systems and methods are resonance agnostic, the array 12 can also receive GPS signal 28, which can typically be approximately in the L band, or in the range from 0.5 to 2 gigahertz (GHz). At the same time the same microantennas for the same the array 12 can detect, receive, and process the magnetic component of PULSARS that are emitting in the millisecond range, or at a frequency of 1000 Hz using the same array 12. The wide range of working frequencies which can be detected by the systems and methods can be why the system is considered frequency agnostic.

Figure 3:
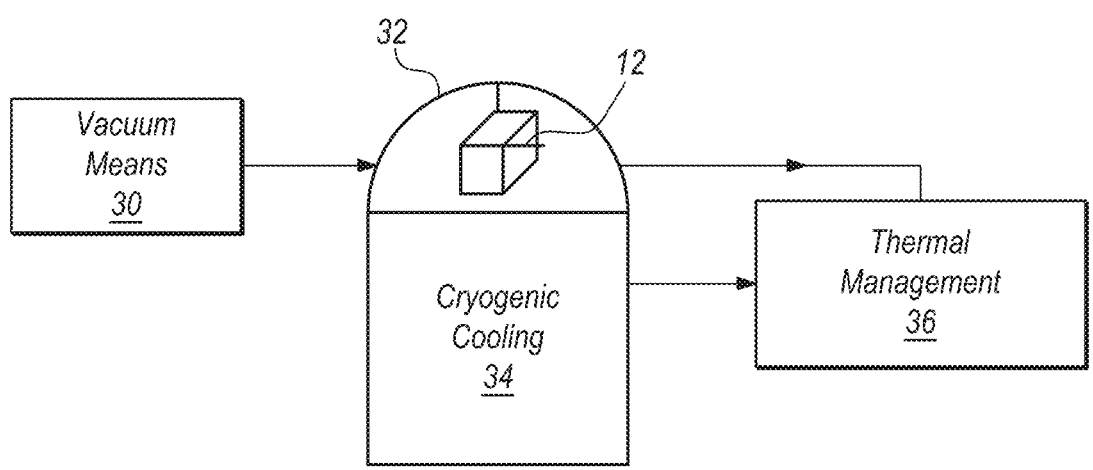
FIG. 3 can be a representation of the micro antenna array, cryogenic cooling sub-system and thermal management interface components of navigation systems and methods of FIG. 2.

To operate the array 12, and referring now to FIG. 3, a cryogenic cooling sub-system 34 and a thermal management interface 36 can be included as part of system 10 to maintain the array 12 at a predetermined operating temperature. Without a properly designed cryogenic cooling sub-system 34, the array 12 may not be able to operate properly. Thermal management interface 36 can be in signal communication with array 12 and with cryogenic cooling sub-systems 34, and can receive temperature inputs from array 12 and can provide a signal that can be based on the operating temperature of array 12 to activate the cryogenic cooling sub-system 34 as necessary to maintain array 12 at the desired temperature. The predetermined operating temperature can be based on the superconducting transition of the material from which the microantenna chips in array 12 can be fabricated.

A radome structure 32 can enclose array 12 and a vacuum means 30 can maintain a vacuum inside radome structure 32, to avoid any condensation of gases in the systems inside radome structure 32, and in particular on array 12 and its surrounding structures. The vacuum can be maintained at about $1 \times 10^{-5}$ millibar (P=$1 \times 10^{-5}$ mbar). The vacuum condition can also be necessary for the reduction of the thermal load on the refrigeration system. Although radome structure 32 can be seen in FIG. 3 as a typical structure (i.e. curved), the vacuum interface 36 can keep the device isolated through vacuum from the external pressure can be in any shape, i.e., a flat window, or any other shape including a structure conformal to a desired platform (ground, surface or air vehicle).

As mentioned above, the predetermined operating temperature of the arrays can depend on the superconducting transition temperature of the materials that can be used for the construction of the microantennas in arrays 12. For example, when the microantennae are made of a high temperature superconductor such as a Yttrium Barium Copper Oxide (YBCO) or a DyBaCuO (also known as Dysprosium Barium Copper Oxide, DBCO) material, the predetermined operating temperature can be set at fifty degrees Kelvin (T=50° K), which can be well below the superconducting transition temperature of these materials. Similarly, when the microantennas are configured using Mercury (HG) material, the predetermined operating temperature can be about one hundred thirty degrees Kelvin (T=130° K). For Niobium (Nb) based superconductors, the predetermined operating temperature can be about nine degrees Kelvin (T=9° K).

As mentioned above, the SQUIDs of the microantennas in array 12 can be composed of any metallic elements such as Niobium, or ceramic, such as YBaCuO and DyBaCuO materials, or any other superconducting material, whether pure metallic, alloy composition, or ceramic. The set of high superconducting temperature (high-Tc) superconductors in the $YBa_2Cu_3O_x$ [$6 \leq x \leq 7$] family can also work as materials for the SQUIDs. When the microantenna SQUIDs are made of the Niobium, the predetermined operating temperature that should be maintained can be nine degrees Kelvin (T=9° K). Similarly, for SQUIDs of YBaCuO materials, the temperature that should be maintained can be below between about 50 and about 77 degrees Kelvin (T=50-77° K) as the optimum operating temperature would be about seventy-seven degrees kelvin (T=77° K). However, the predetermined operating temperature for several of these embodiments could be any temperature that is less than 93° K. Still further, other materials that have been used to make SQUIDs can include $Nb_3Ge$ along with Bismuth Strontium Calcium Copper Oxide (BSCCO) and Thallium-Barium-Calcium-Copper-Oxide (Tl—Ba—Ca—Cu—O) families can also be used. Other organic superconductors could also be used.

Notwithstanding the chosen microantenna materials and corresponding predetermined operating temperature, the vacuum means 30 can maintain the aforementioned desired pressure, while cryogenic cooling sub-system 34 and thermal management interface 36 can cooperate to provide temperature adjustments for system 10, for any transition temperature down to the desired predetermined operating temperature; the system can also be modified to achieve still lower temperatures.

The inner and/or outer surface(s) of vacuum radome structure 32 can also be coated with material that is reflective at selected frequencies that are not of interest to the user, to assist on keeping the temperature stable at the sensor position. The vacuum radome structure 32 can be transparent to other, application specific electromagnetic radiation. The emitting device can be mounted on a chip carrier specifically engineered to maximize the output power of the emitter. The array chip can be mounted to a thermal carrier (not shown in FIG. 3), such as an Aluminum Nitride (AlN) carrier, or a chip carrier of any other material that provides good thermal conductivity with cryogenic cooling sub-system 34, and that does not interfere in the intended array 12 performance. The carrier, as previously mentioned, can also be kept at the necessary temperature of operation. The thermal carrier and device carrier can form a permanent fixture. A wide range of array chip geometries with various pin-outs can be mounted and tailored to a specific array device. Customization can be done in terms of power, wavelength, and any other parameter typical of such a device. Still further, the array 12 of microantennas can incorporate a 3D grating system and/or technique that can control the amplitude and frequency. Still further, a low pass/high pass filter can be embedded on array 12, by using a diamond pattern for the SQUID configuration, and control of the magnetic field at the plane of the device by the use of a high permeability material such as mu-metal or other materials.

One way to accomplish the microantenna geometry above can be described in U.S. patent application Ser. No. 15/230, 656, by Susan Anne Elizabeth Berggren et al., entitled "Tiered Superconducting Quantum Interference Device (SQUID) Array". The contents of the '656 application are hereby incorporated by reference. Other methodologies are also possible to accomplishing a desired array 12 geometry, as well as for providing an active cancellation at the plane of the SQUIDs in array 12, in order to remove any unwanted signal or background noise as described above.

Because of the above configuration(s), the array of microantennas of SQUIDs can be engineered to optimize detection frequency at very low power levels. The array 12 can be made mobile for mounting on land, sea, and air vehicles, and also any platform 22 having a dimension of less than 1 meter and/or a radar cross section of less than one meter squared (RCS=1 m$^2$). The array 12 can even perform the operation of detection of pulses 16 from PULSARs 18 with an array 12 that is made of a single chip (microantenna). Also, since the arrays 12 can be designed for specific emission frequencies of PULSARs pulses 16, which can be known and distinct, a specific "key" sequence of detection of magnetic component φ TOA's at array 12 can be timed, to minimize any man-made or natural interfering signals or attempt at spoofing the PULSARs signals. This can result in more persistent, reliable, assured and affordable navigation solutions, when compared to navigation systems and methods of the prior art.

The microantennas in array 12 can be compatible with monolithic fabrication with silicon-based electronics, and thus can use the memory, interfaces, and drive electronics inherent in silicon-based technology. This implies that array 12 can be co-fabricated to reduce size-weight and power even further, improving its use on miniature platforms, including unmanned platforms such as unmanned underwater vehicles (UUV's), unmanned surface vehicles (USV's) and unmanned aerial vehicles (UAV's). When monolithically fabricated on a sapphire (Al$_2$O$_3$) substrate, array 12 itself can also serve as a thermal carrier, similar to Aluminum Nitride (AlN) carrier or any other material that provides good thermal conductivity, and does not interfere in the intended array performance. The system can also include a frequency source such as the aforementioned crystal oscillator 14 or atomic frequency standard that can be used to measure the Time of Arrival of pulses 16 of PULSARs 18.

The oscillator 14 can be configured to establish a spatial-temporal synchronization that can be based on the times of arrival (TOAs) of pulses 16, and the celestial position of PULSARs 18, which can be known beforehand. There are a number of PULSARs that can be used as a source of highly stable, reliable signals, which can be used simultaneously to establish precise time and location. The detected signals can be amplified and used as a reference for a time and navigation system. Thus, systems 10 and methods of the present invention according to several embodiments can be seen as a "galactic GPS" system where the signal sources can PULSAR pulses 16 instead of the GPS signals 28 from GPS 26. Precise change in position and clock drift can be measured using TOA measurements of a sufficient number of PULSARs, or any other mathematical formulation to achieve precise timing and localization.

Figure 4:
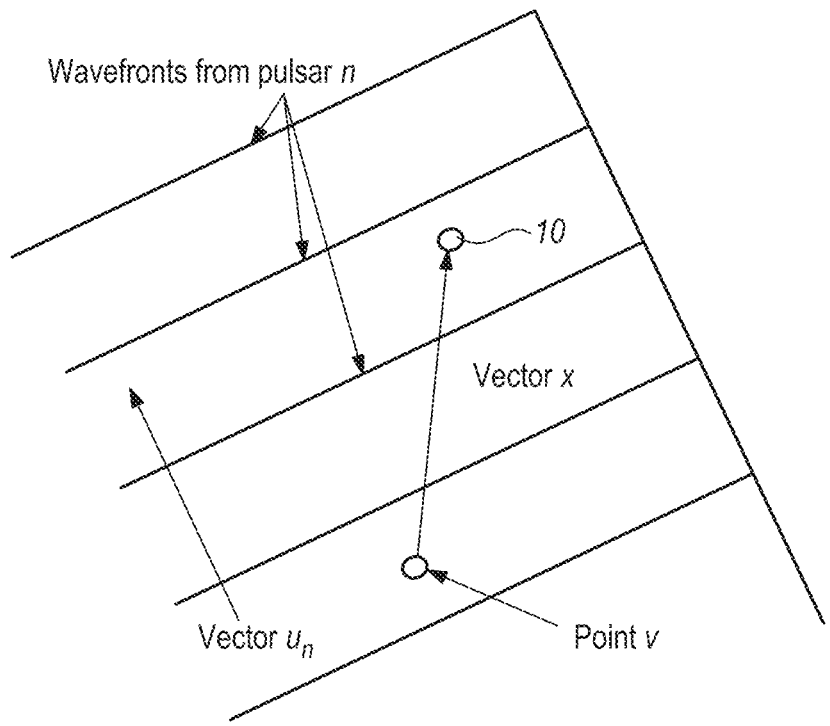
FIG. 4 can be a three-dimensional representation of how PULSAR's are received at the micro antenna array of FIG. 2, which further can be used to understand how the processor for the system of FIG. 2 can calculate the terrestrial position of the systems and methods of the present invention; and, FIG. 5 can be a block diagram, which can be representative of steps that can be taken to accomplish the methods of the present invention according to several embodiments.

Referring now to FIG. 4, the method for calculating the position and timing of the TOA's of pulses 16 from PULSARs 18 at array 12 can be described, using the geometry that can be depicted in FIG. 4, and the derivation, which follows below. As stated previously, TOA measurements can be taken on the pulses 16 of radiation come from N PULSARs 18 that are being used for navigation. A PULSAR n can have a distinct pulse frequency which can be described a function of time, $f_n$ (t), such that the cycle evolution at a point v in space $\phi_{n,v}$ (t) can be modeled as:

$$\phi_{n,v}(t)=\phi_{n,v}(T_0)+f_n(t-T_0)+\Sigma_m[f_{n,m}(t-T_0)^m/(m)!] \quad (1)$$

Where $T_0$ can represent a given time, and $f_{n,m}$ is the m$^{th}$ derivative of $f_n$. As the position of system 10 moves away from the point v, the TOA of PULSAR n signal can change according to the relationship:

$$\phi_{n,x}(t)=\phi_{n,v}(T_0)+f_n(t-T_0-u_n^T x/C) \quad (2)$$

Where the vector x points from the point v to the location of system 10, c is the speed of light, $u_n^T$ is the unit vector pointing towards the n$^{th}$ pulsar with the transverse operator applied, and the derivative of the pulse frequency has been dropped for simplicity (a valid approximation for short time scales.)

An ambiguity may arise when relating cycles in two places at two times, if the precise distance between points or the precise timing of the TOA measurements is unknown. This cycle number ambiguity can be modeled by adding an unknown integer $I_m$ to equation (2):

$$\phi_{n,x,t}(t)=\phi_{n,v}(T_0)+f_n(t-T_0-u_n^T x/C)+I_m \quad (3)$$

Thus, the difference in cycles seen by two points is:

$$\lambda_n=\text{inv}(f_n(\phi_{n,x,t}(t)-\phi_{n,v}(T_0)))=t-T_0-u_n^T x/c+\text{inv}(f_n(I_m)).$$

Using the above Equations (1)-(4) for 1 through N pulsars can result in a series of linear equations that can solve for the position x of the invention with respect to a known position, such as the center of the solar system, or a terrestrial position on Earth, or to compute the difference in the position of the invention in between sequential measurements. Additionally, equations (1)-(4) can be applied by processor, independently of the coordinate system referenced, the is being used to describe the celestial position of PULSAR 18, i.e. any cartesian coordinate system could be used. Commonly in this situation one would use an Earth Centered Earth Fixed (ECEF) coordinate system. An alternative system such as a North East Down (NED) coordinate system, referenced to some base latitude/longitude/altitude, could also be used. The coordinate system does not need to be referenced to any celestial coordinates.

In the presence of imperfect measurements, equation (4) can be modified to include components that model the noise associated with the measurements. The use of maximum likelihood methods can yield optimal estimates in the case of zero mean Gaussian noise.

Figure 5:
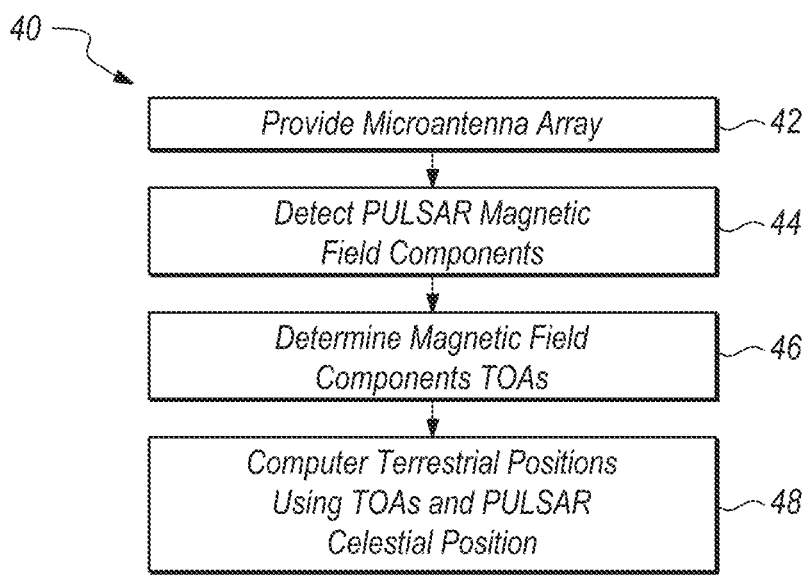

Referring now to FIG. 5, a block diagram is shown, which can be used to illustrate steps that can be taken to accomplish the methods according to several embodiments. As shown, method 40 can include the initial step 42 of providing an array 12 of microantennas, and then detecting the magnetic components $\phi_n$ of the radiation pulses 16 of PULSARs 18, as depicted by block 44 in FIG. 5. As shown by block 46, the methods of several embodiments can include the step of determining the times of arrival (TOA's) of the magnetic components $\phi_n$ of the radiation pulses 16 at array 12. The methods can further include the step 48 of computing the terrestrial position of the platform that the array 12 can be installed on (located at), using the TOA's from step 46 and the known celestial positions of the PULSARs 18, which can be stored in a database 24 and accessed as necessary by processor 20. The methods can optionally include the step of receiving a GPS signal 28 and array 12 and accomplishing step 48 when the GPS signal is lost/denied or is unavailable to the user for navigation, or when the user does not trust the veracity of the GPS signal (i.e. the user believes the GPS signal is being "spoofed").

The systems and methods of the present invention can pertain to the use of PULSARs in the millisecond range, using the structure, cooperation of structure and method steps as described above. It should be appreciated, however, that because the systems and methods are frequency agnostic, and the systems and methods use the magnetic component of received radiation as described above, any celestial body, whether natural or man-made, could be used in the navigation systems and methods described here, as long as the celestial position of the body, the frequency at which the body is radiating is known, and the frequency of the body's radiated pulses is known. This information could be stored in database 24 using the systems and methods according to several embodiments.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising", "having", "including" and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A navigation system comprising:
   at least one microantenna arranged as an array;
   said at least one microantenna detecting magnetic field components of PULSARs;
   an oscillator connected to said at least one microantenna, for determining times of arrival (TOAs) of said radio frequency energy at said array; and,
   a processor, said processor computing a terrestrial position of said system using said TOAs and known celestial positions of said PULSARs as inputs.

2. The system of claim 1, wherein said at least one microantenna further comprises a plurality of Josephson Junctions, and wherein said microantenna includes a cryogenic cooling sub-system for cooling said Josephson Junctions to a predetermined operating temperature, and a thermal management interface for maintaining said Josephson Junctions at said predetermined operating temperature.

3. The system of claim 2, wherein said Josephson Junctions are made of a material selected from the group consisting of Yttrium Barium Copper Oxide (YBCO) or Dysprosium Barium Copper Oxide (DBCO) and said predetermined operating temperature is less than 93° K.

4. The system of claim 2, wherein said Josephson Junctions are made of a Mercury (Hg) material and said predetermined operating temperature is about 130° K.

5. The system of claim 2, wherein said Josephson Junctions are made of a Niobium (Nb) material and said predetermined operating temperature is about 9° K.

6. The system of claim 1, wherein said processor computes a terrestrial position using a formula $\lambda_n = \text{inv}(f_n \Phi_{n,x,I}(t) - \Phi_{n,v}(T_0))) = t - T_0 - u_n^T x/c + \text{inv}(f_n(l_m))$, where a PULSAR n has a distinct pulse frequency which is a function of time at time t, $f_n(t)$, so that a cycle evolution at a point v in space of a magnetic component $\Phi_n$ of said PULSAR n is $\Phi_{n,v}$, where x is a vector that points from said point v to the location of said system, c is the speed of light, $u_n^T$ is the unit vector pointing towards the $n^{th}$ said PULSAR with the transverse operator applied, where I is an integer number to model cycle ambiguity, and where $\lambda_n$ is emitted wavelength for said PULSAR n, $T_0$ represents a said TOA given time, and $f_{n,m}$ is the $m^{th}$ derivative of said $f_n$.

7. The system of claim 6, wherein said PULSARS each have a corresponding signal strength, and wherein said processor accomplishes said formula three times, using the strongest three said signal strengths, to result in three equations in three unknowns, said x, said u and said v, to determine said terrestrial position of said system.

8. The system of claim 1, further comprising a Global Positioning Satellite (GPS), said GPS having a GPS signal with a corresponding GPS signal strength, and further wherein said processor computes said terrestrial location using said magnetic field components when said GPS signal strength falls below a predetermined level.

9. A method for terrestrial navigation, comprising the steps of:
   A) providing at least one microantenna arranged as an array;
   B) detecting the magnetic field components of pulsating radio stars (PULSAR) radiation pulses with said at least one microantenna;
   C) connecting an oscillator to said at least one microantenna, for determining a time of arrival (TOA) for each of said magnetic field components at said array; and,
   D) computing a terrestrial position using said TOAs and a database of known celestial positions of said PULSARS as inputs using a processor, wherein said processor computes a terrestrial position using a formula $\lambda_n = \text{inv}(f_n(\varphi_{n,x,i}(t) - \Phi_{n,v}(T_0))) = t - T_0 - u_n^T x/c + \text{inv}(f_n(l_m))$, wherein a PULSAR n has a distinct pulse frequency which is a function of time at time t, $f_n(t)$, so that a cycle evolution at a point v in space of a magnetic component $\Phi_n$ of said PULSAR n is $\Phi_{n,v}$, x is a vector that points from said point v to the location of said system, c is the speed of light, $u_n^T$ is the unit vector pointing towards the $n^{th}$ said PULSAR with the transverse operator applied, and $\lambda_n$ is the emitted wavelength of said PULSAR n, $T_0$ represents a given said TOA time, and $f_{n,m}$ is the $m^{th}$ derivative of said $f_n$.

10. The method of claim 9, wherein said step B) is accomplished for said radiation pulses in the millisecond range.

11. The method of claim 9, wherein said array in said step A) comprises a plurality of Josephson Junctions (JJs), and further comprises the steps of:
   E) cooling said JJs to a predetermined operating temperature with a cryogenic cooling system in thermal contact with said JJs; and,
   F) maintaining said predetermined operating temperature with a thermal management system that is connected to said cryogenic cooling system and said JJs.

12. The method of claim 11, wherein said JJs are made of a material selected from the group consisting of YBCO and DBCO and said predetermined operating temperature is about 50° K.

13. The method of claim 11, wherein said JJs are made of a mercury (Hg) material and said predetermined operating temperature is about 130° K.

14. The method of claim 11, wherein said JJs are made of a Niobium (Nb) material and said predetermined operating temperature is about 9° K.

15. The method of claim 9, wherein said PULSARS each have a corresponding signal strength, and wherein said processor accomplishes said step D) three times, using the three said signal strengths from said step D) to result in three equations in three unknowns, said x, said u and said v, to determine said terrestrial position.

16. The method of claim 9, further comprising the step of:
E) receiving a GPS signal from a GPS navigation system, said GPS signal having a GPS signal strength, and further wherein said step D) is accomplished when said GPS signal strength falls below a predetermined level.

17. A navigation system comprising:
a GPS receiver for receiving GPS signals, said GPS signals each having a corresponding GPS signal strengths;
at least one microantenna arranged as an array, said at least one microantenna configured to detect the magnetic field components of pulsating radio star (PULSAR) radiation pulses;
an oscillator connected to said at least one microantenna, for determining a corresponding time of arrival (TOA) of each said magnetic field component at said array;
a processor, said processor computing a terrestrial position of said system using said GPS signals, wherein said processor computes the terrestrial position using a formula $\lambda_n = \text{inv}(f_n(\Phi_{n,x,t}(t) - \Phi_{n,v}(T_0))) = t - T_0 - u_n^T x/c + \text{inv}(f_n(l_m))$, wherein a said PULSAR n has a distinct pulse frequency which is a function of time at time t, $f_n(t)$, so that a cycle evolution at a point v in space of a magnetic component $\Phi_n$ of said PULSAR n is $\Phi_{n,v}$, x is a vector that points from said point v to the location of said system, c is the speed of light, $u_n^T$ is the unit vector pointing towards the $n^{th}$ said PULSAR with the transverse operator applied, and $\lambda_n$ is the emitted wavelength of said PULSAR n, $T_0$ represents a given said TOA time, and $f_{n,m}$ is the $m^{th}$ derivative of said $f_n$; and,
said processor further calculating a terrestrial position of said system using said TOAs and of known celestial positions of said PULSARS as inputs.

18. The system of claim 17, wherein said calculations and said computations are accomplished simultaneously, and further wherein said calculations are used as a primary means of navigation for said navigation system when said GPS signal strengths fall below a predetermined level.

* * * * *